United States Patent
Levy et al.

(10) Patent No.: US 7,691,749 B2
(45) Date of Patent: Apr. 6, 2010

(54) DEPOSITION OF TUNGSTEN NITRIDE

(75) Inventors: Karl B. Levy, Los Altos, CA (US); Junghwan Sung, Los Altos, CA (US); Kaihan A. Ashtiani, Sunnyvale, CA (US); James A. Fair, Mountain View, CA (US); Joshua Collins, Sunnyvale, CA (US); Juwen Gao, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 937 days.

(21) Appl. No.: 11/305,368

(22) Filed: Dec. 16, 2005

(65) Prior Publication Data

US 2006/0094238 A1 May 4, 2006

Related U.S. Application Data

(62) Division of application No. 10/690,492, filed on Oct. 20, 2003, now Pat. No. 7,005,372.

(60) Provisional application No. 60/441,834, filed on Jan. 21, 2003.

(51) Int. Cl.
*H01L 21/44* (2006.01)

(52) U.S. Cl. .................. 438/680; 438/627; 438/653; 438/656; 438/685; 257/E21.171

(58) Field of Classification Search ................ 438/656, 438/680, 685, 655, 627, 628, 643, 653, 654; 257/E21.171
See application file for complete search history.

(56) References Cited

U.S. PATENT DOCUMENTS 4,804,560 A    2/1989  Shioya et al.

(Continued)

FOREIGN PATENT DOCUMENTS

WO    WO01/27147    4/2001

OTHER PUBLICATIONS

U.S. Office Action mailed May 17, 2006, from U.S. Appl. No. 10/984,126.

(Continued)

*Primary Examiner*—Thanhha Pham
(74) *Attorney, Agent, or Firm*—Weaver Austin Villeneuve & Sampson LLP

(57) ABSTRACT

Methods for depositing a tungsten nitride layer are described. The methods form a tungsten nitride layer using a carefully controlled deposition technique such as pulsed nucleation layer (PNL). Initially, a tungsten layer is formed on a substrate surface. The tungsten layer is then exposed to a nitriding agent to form a tungsten nitride layer. Methods of forming relatively thick layers of involve repeated cycles of contact with reducing agent, tungsten precursor and nitriding agent. In some cases, the cycle may also include contact with a dopant precursor such as phosphine or arsine.

18 Claims, 3 Drawing Sheets

U.S. PATENT DOCUMENTS

| | | | |
|---|---|---|---|
| 5,028,565 | A | 7/1991 | Chang et al. |
| 5,227,329 | A | 7/1993 | Kobayashi et al. |
| 5,250,329 | A | 10/1993 | Miracky et al. |
| 5,326,723 | A | 7/1994 | Petro et al. |
| 5,391,394 | A | 2/1995 | Hansen |
| 5,661,080 | A | 8/1997 | Hwang et al. |
| 5,726,096 | A | 3/1998 | Jung |
| 5,795,824 | A | 8/1998 | Hancock |
| 5,804,249 | A | 9/1998 | Sukharev et al. |
| 5,817,576 | A | 10/1998 | Tseng et al. |
| 5,956,609 | A | 9/1999 | Lee et al. |
| 6,001,729 | A | 12/1999 | Shinriki et al. |
| 6,017,818 | A | 1/2000 | Lu |
| 6,037,263 | A | 3/2000 | Chang |
| 6,066,366 | A | 5/2000 | Berenbaum et al. |
| 6,099,904 | A | 8/2000 | Mak et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 * | 4/2004 | Anderson et al. ........... 438/687 |
| 6,740,585 | B2 | 5/2004 | Yoon et al. |
| 6,844,258 | B1 | 1/2005 | Fair et al. |
| 6,861,356 | B2 | 3/2005 | Matsuse et al. |
| 6,902,763 | B1 * | 6/2005 | Elers et al. .................. 427/250 |
| 6,936,538 | B2 | 8/2005 | Byun |
| 6,962,873 | B1 | 11/2005 | Park |
| 7,005,372 | B2 | 2/2006 | Levy et al. |
| 7,141,494 | B2 | 11/2006 | Lee et al. |
| 7,262,125 | B2 | 8/2007 | Wongsenakhum et al. |
| 7,429,402 | B2 | 9/2008 | Gandikota et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 * | 6/2003 | Fang et al. ............ 427/255.392 |
| 2003/0127043 | A1 | 7/2003 | Lu et al. |
| 2004/0044127 | A1 | 3/2004 | Okubo et al. |
| 2004/0206267 | A1 | 10/2004 | Sambasivan et al. |
| 2005/0136594 | A1 | 6/2005 | Kim |
| 2006/0094238 | A1 | 5/2006 | Levy et al. |

OTHER PUBLICATIONS

U.S. Office Action mailed Apr. 17, 2006, from U.S. Appl. No. 10/815,560.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074.

Notice of Allowance and Fee Due mailed Jul. 21, 2006, from U.S. Appl. No. 10/649,351.

Allowed Claims from U.S. Appl. No. 10/649,351.

Notice of Allowance and Fee Due mailed Oct. 7, 2004, from U.S. Appl. No. 10/435,010.

Allowed Claims from U.S. Appl. No. 10/435,010.

Notice of Allowance and Fee Due mailed Aug. 25, 2006, from U.S. Appl. No. 10/984,126.

Notice of Allowance and Fee Due mailed Sep. 14, 2005, from U.S. Appl. No. 10/690,492.

Allowed Claims from U.S. Appl. No. 10/690,492.

Notice of Allowance and Fee Due mailed Apr. 24, 2007, from U.S. Appl. No. 10/815,560.

Allowed Claims from U.S. Appl. No. 10/815,560.

Gao et al., "Methods for Improving Uniformity and Resistivity of Thin Tungsten Films," Novellus Systems, Inc, filed Jul. 24, 2007, U.S. Appl. No. 11/782,570, pp. 1-23.

U.S. Office Action mailed Dec. 28, 2005, from U.S. Appl. No. 10/815,560.

U.S. Office Action mailed Dec. 28, 2005, from U.S. Appl. No. 10/649,351.

Wongsenakhum et al., "Reducing Silicon Attack and Improving Resistivity of Tungsten Nitride Film", Novellus Systems, Inc., filed Feb. 6, 2006, Application No. Not yet assigned, pp. 1-26.

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

Wongsenakhum et al., "Method of Forming Low-Resistivity Tungsten Interconnects", Novellus Systems, Inc., filed Mar. 31, 2004, U.S. Appl. No. 10/815,560, pp. 1-30.

U.S. Office Action mailed Jul. 17, 2002, from U.S. Application No. 09/975,074.

U.S. Office Action mailed Feb. 8, 2005, from U.S. Application No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

Levy e al., "Deposition of Tungsten Nitride", Novellus Systems, Inc., filed Oct. 20, 2003, U.S. Appl. No. 10/690,492, pp. 1-42.

Lee et al., "Method for Reducing Tungsten Film Roughness and Improving Step Coverage", Novellus Systems, Inc., filed Aug. 26, 2003, U.S. 10/649,351, pp. 1-40.

Fair et al., "Selective Refractory Metal and Nitride Capping", Novellus Systems, Inc., filed Nov. 8, 2004, U.S. Appl. No. 10/984,126, pp. 1-22.

U.S. Office Action mailed Nov. 8, 2004, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

U.S. Office Action mailed Sep. 28, 2006, from U.S. Appl. No. 10/815,560.

U.S. Office Action mailed Oct. 16, 2008, from U.S. Appl. No. 11/349,035.

U.S. Office Action mailed Sep. 29, 2008, from U.S. Appl. No. 11/782,570.

Ashtiani et al., "Ternary Tungsten-Containing Thin Films," Novellus Systems, Inc., U.S. Appl. No. 12/363,330, filed Jan. 30, 2009.

Chandrashekar et al., "Method for depositing thin tungsten film with low resistivity and robust micro-adhesion characteristics," Novellus Systems, Inc., U.S. Appl. No. 61/061,078, filed Jun. 12, 2008.

U.S. Office Action mailed Aug. 21, 2008, from U.S. Appl. No. 11/265,531.

Ashtiani et al., "Ternary Tungsten-Containing Thin Film Heater Elements," Novellus Systems, Inc., U.S. Appl. No. 61/025,237, filed Jan. 31, 2008.

Chen et al., "Method for Reducing Tungsten Roughness and Improving Reflectivity," Novellus Systems, Inc., U.S. Appl. No. 12/202,126, filed Aug. 29, 2008.

U.S. Final Office Action mailed Apr. 28, 2009, from U.S. Appl. No. 11/782,570.

U.S. Office Action mailed Apr. 3, 2009, from U.S. Appl. No. 11/305,368.

U.S. Final Office Action mailed Feb. 26, 2009, from U.S. Appl. No. 11/265,531.

U.S. Notice of Allowance mailed May 4, 2009 from U.S. Appl. No. 11/265,531.

U.S. Final Office Action mail Feb. 25, 2009, from U.S. Appl. No. 11/349,035.

U.S. Office Action mailed Jun. 11, 2009, from U.S. Appl. No. 11/963,698.

U.S. Office Action mailed Jun. 24, 2009 from U.S. Appl. No. 12/030,645.

Ken K. Lai and H. Henry Lamb, Precursors for Organometallic Chemical Vapor Deposition of Tungsten Carbide Films, 1995, Chemistry Material, pp. 2284-2292.

* cited by examiner

DEPOSITION OF TUNGSTEN NITRIDE

CROSS-REFERENCE TO RELATED PATENT APPLICATIONS

This application is a divisional application of and claims priority from U.S. patent application Ser. No. 10/690,492, filed on Oct. 20, 2003, now U.S. Pat. No. 7,005,372 entitled "DEPOSITION OF TUNGSTEN NITRIDE," by Karl B. Levy et al. as inventors; which claims priority under 35 USC 119(e) from U.S. Provisional Patent Application No. 60/441,834 filed Jan. 21, 2003, naming Fair et al. as inventors, which are incorporated herein by reference in its entirety. This application is also related to the U.S. application Ser. No. 09/975,074 (issued as U.S. Pat. No. 6,635,965) filed Oct. 9, 2001, entitled ULTRA THIN TUNGSTEN LAYER WITH IMPROVED STEP COVERAGE, by Lee et al., and U.S. application Ser. No. 10/649,351, filed Aug. 26, 2003, entitled METHOD FOR REDUCING TUNGSTEN FILM ROUGHNESS AND IMPROVING STEP COVERAGE, by Lee et al., which is incorporated herein by reference for all purposes.

FIELD OF THE INVENTION

This invention pertains to pulsed nucleation layer (PNL) methods for depositing tungsten nitride. Specifically, the invention pertains to methods that deposit tungsten nitride on partially fabricated semiconductor devices. The invention is particularly useful for applications that require metal or metal nitride deposition on dielectrics, metals, silicides, and silicon with good adhesion, excellent step coverage, and low processing temperatures (e.g., 400° C. or lower).

BACKGROUND

Tungsten nitride is used in several applications for semiconductor device fabrication. As deposited by traditional means such as PVD and PECVD, tungsten nitride provides relatively low resistivity, good adhesion to dielectric films, and is a good diffusion barrier. A key limitation that has prevented wider application of WN in the past has been poor step coverage in high aspect ratio trenches, vias and contacts.

To be successful in nanometer scale applications, tungsten nitride must be deposited thinly and conformally in high aspect ratio features. Conventional physical vapor deposition (PVD) techniques are not able to meet these criteria. To accomplish thin conformal coverage, chemical vapor deposition (CVD) methods are typically considered. A conventional CVD process involves the simultaneous introduction of gas phase reactants, including tungsten precursor (typically tungsten hexafluoride ($WF_6$)) and a nitrogen containing gas (e.g., $N_2$), near a heated wafer surface while a vacuum is applied to the system. The reaction is driven by the energy provided by the heated wafer and the free energy change of the chemical reaction. The growth of the tungsten nitride film continues as long as the reactants and energy source are available.

Although standard tungsten nitride CVD techniques can provide good step coverage and adequately fill low aspect ratio features (e.g., <5:1 aspect ratio), as semiconductor fabrication technology approaches the nanometer scale, the demands for step coverage and gap filling are becoming more stringent and CVD may not be suitable for the task. Traditional plasma-enhanced CVD of tungsten nitride has relatively poor step coverage for a CVD process (<50% SC in a 5:1 aspect ratio cylindrical contact). This is not adequate for the demands of current and future semiconductor technology with aspect ratios exceeding 10 to 1 and critical dimensions less than 100 nanometers. CVD and particularly PNL or ALD tungsten processes (as opposed to tungsten nitride processes) can provide the very high step coverage and conformal deposition required for modern semiconductor devices, but will not adhere directly to dielectric surfaces. Tungsten now requires an adhesion layer such as TiN before deposition on dielectric surfaces. Finally, the high deposition temperatures required by many TiN deposition techniques (e.g. PECVD-TiN from $TiCl_4$) require high deposition temperatures that are incompatible with low-K dielectrics or nickel silicide.

What are therefore needed are improved methods for depositing tungsten nitride.

SUMMARY OF THE INVENTION

The present invention provides methods for depositing a tungsten nitride layer on a substrate, where the methods provide good tungsten nitride adhesion to the substrate, fine control over deposition thickness, and good step coverage over high aspect ratio regions of the substrate. To accomplish this, the invention provides a pulsed nucleation layer method for depositing tungsten nitride. Generally, the invention employs at least the following operations (performed in various orders): (i) providing a layer of reducing agent on a substrate surface, (ii) contacting the substrate surface with a tungsten containing precursor to form a tungsten layer on the substrate, and (iii) nitriding the tungsten layer to form tungsten nitride.

In many cases, the substrate is a semiconductor wafer or a partially fabricated semiconductor wafer. Applications of the invention include using tungsten nitride as (or as part of) a copper diffusion barrier, a gate electrode, a capacitor electrode, and a diffusion barrier and/or adhesion layer in tungsten plugs, a sacrificial hard mask for use in dual damascene copper interconnect formation, and a light shield for CCD devices. Of course, the invention can be used in other applications requiring high-quality tungsten nitride layers. In many of these applications, the tungsten nitride is deposited at least partially over a dielectric material.

In some preferred embodiments, the reducing agent is a boron-containing agent, preferably a borane such as diborane ($B_2H_6$). The borane reducing agent may be introduced as a gas phase reactant that decomposes on the substrate surface, creating a boron containing "sacrificial layer." Preferably, this sacrificial layer is between about 3 and 20 angstroms thick and deposited at a temperature between about 200 and 400 degrees C.

In alternative embodiments, the reducing agent is a silane or other non-boron-containing reducing agent. In such embodiments, the reducing agent may be introduced to the substrate to form an adsorbed or saturated layer prior to introducing the tungsten-containing precursor. Alternatively, the tungsten-containing precursor can be introduced to the substrate before the reducing agent. If the tungsten-containing precursor is introduced before the reducing agent, a thin layer of tungsten-containing precursor forms on the substrate and is subsequently decomposed to form tungsten upon contact with the reducing agent.

In some embodiments, the tungsten-containing precursor is $WF_6$, $WCl_6$, or $W(CO)_6$. Of course, other tungsten-containing precursors suitable for reduction to elemental tungsten can be employed, including a combination of tungsten-containing precursors (whether gases, liquids, or solids). Also, any suitable nitriding agent can be used. Examples include $N_2$, $NH_3$, $NF_3$, $N_2H_6$, and combinations thereof.

In certain embodiments of the invention, a gas purge is employed after exposure to one or more of the reactants; e.g., the reducing agent, the tungsten containing precursor, and the nitriding agent. In many cases, a gas purge is employed after each of the reactants is introduced. The gas purge clears the regions near the substrate surface of residual gas reactants that could react with fresh gas reactants for the next reaction step. In some embodiments of the invention, it is preferable to treat the tungsten layer with hydrogen or Ar—$H_2$ plasma before the nitridation step to remove the halogen byproducts, unreacted halogen reactants, or other undesirable gases before the introduction of the nitriding agent.

In another aspect of the invention, the tungsten nitride is deposited in a dedicated tungsten nitride module with one or more deposition stations. The tungsten nitride module contains a wafer preheat station, and a substrate preclean station. The preclean module provides features for a reactive preclean that makes use of a fluorine based clean chemistry generated by dissociation of a fluorine containing reagent using an inductively coupled plasma. Further, the wafer preclean station or another station in the tungsten nitride deposition module possesses features for passivating the substrate after substrate precleaning. Preferably, the module for tungsten nitride deposition is vacuum integrated with a module dedicated for pulsed nucleation of tungsten or CVD of tungsten.

In one embodiment, the method also passivates the substrate by means of one or more of the following: (a) hydrogen exposure; (b) exposure to a remote $H/H_2$ plasma; (c) exposure to direct $H/H_2$ or $Ar/H/H_2$ or a RF plasma; (d) exposure to $WF_6$; (e) exposure to $H_2$ or $H/H_2$ plasma and $NH_3$ in series or simultaneously; and (f) exposure to oxygen.

Yet another aspect of the invention provides a method of forming a tungsten nitride layer on a substrate, which method is characterized by the following sequence: (a) positioning the substrate in a deposition chamber; (b) depositing a one or more layers of pulsed deposition tungsten on the semiconductor wafer; (c) depositing one or more layers of pulsed deposition tungsten nitride on the one or more layers of tungsten; and (d) optionally repeating (b)-(c) to generate either a bilayer of W—WN or a multi-layered structure of multiple tungsten and tungsten nitride layers. The resulting composite film can have various layered structures. In one embodiment, the bottom layer of the W—WN composite film is a tungsten layer. In another embodiment, the bottom layer of the W—WN composite film is a WN layer. In one specific embodiment, the ratio of W and N atoms are present in the W and WN layers in a ratio of approximately 2-to-1, such that stoichiometric $W_2N$ is formed directly, or indirectly by a heat treatment.

A specific aspect of the invention pertains to depositing tungsten nitride over an inter-metal dielectric material to act as a copper diffusion barrier. In these applications, a tungsten layer may be deposited over the tungsten nitride layer. Thereafter, copper is deposited on the tungsten nitride or W—WN barrier to create a film stack suitable for single or dual damascene copper interconnect formation.

If a metallic tungsten layer is employed as part of a WN—W barrier system, it may be deposited using pulsed nucleation layer (PNL) methods, atomic layer deposition methods, or CVD methods (e.g., using $WF_6$ and $H_2$ or $SiH_4$ or any combination thereof). In conventional Damascene processes, the copper layer is provided first as a copper seed layer, which can be deposited using sputter deposition or electroless plating methods. After the copper seed layer is deposited, a bulk copper layer can be deposited over the seed layer using electrolytic plating methods.

Another aspect of the invention pertains to use of tungsten nitride, which may be used in combination with a tungsten layer on the tungsten nitride, to form a gate electrode. In another application, a tungsten nitride layer or a tungsten nitride-tungsten bilayer is used to form capacitor electrodes for DRAM or other storage devices. These and other features and advantages of the invention will be described in more detail below with reference to the associated drawings.

DETAILED DESCRIPTION OF A PREFERRED EMBODIMENT

Introduction

Figure 1:
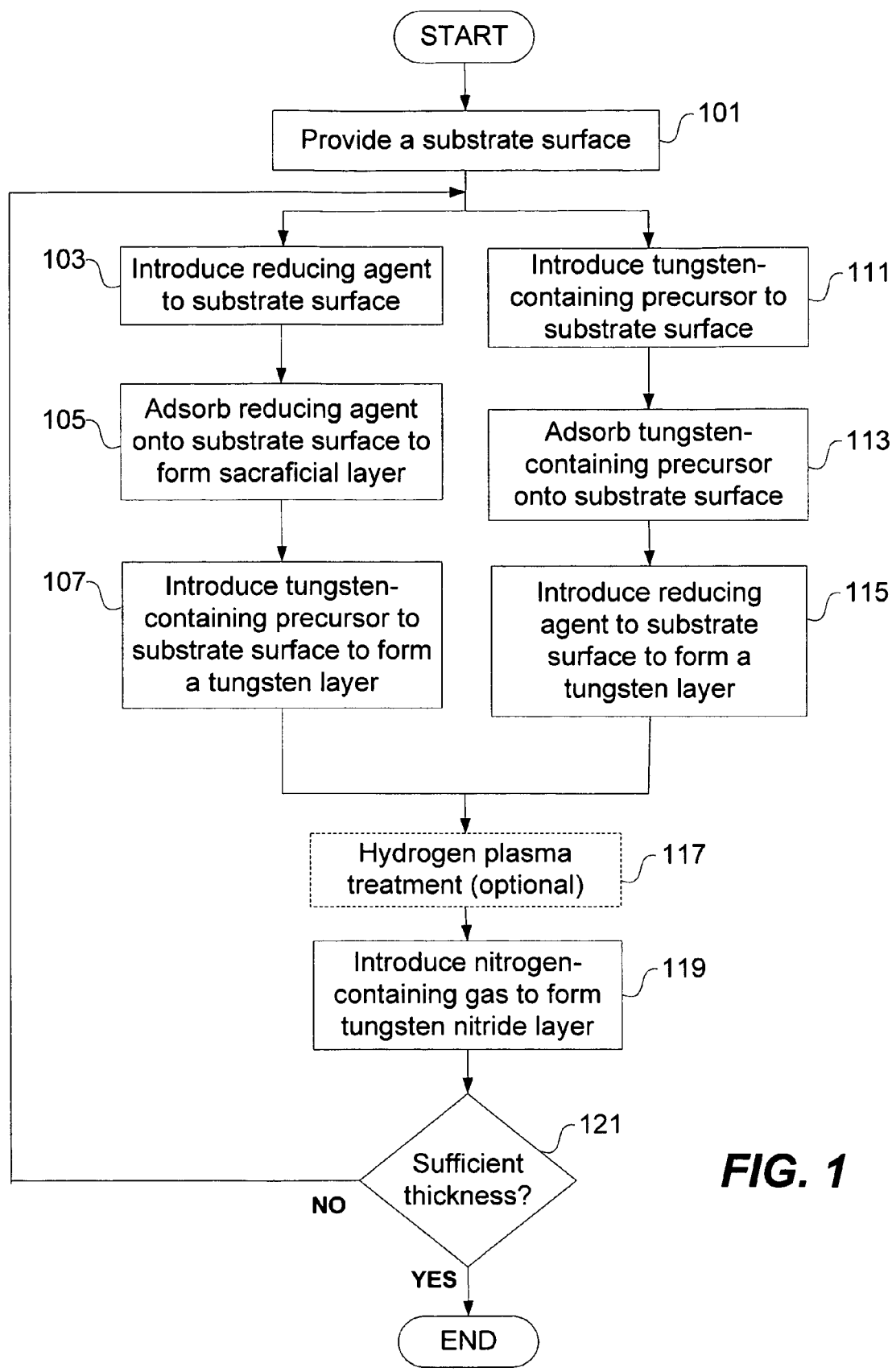
FIG. 1 is a process flow diagram illustrating relevant operations employed in the present invention. A thin, conformal tungsten metal layer is formed onto a substrate, followed by nitridation of the tungsten metal to form tungsten nitride.

As indicated, the present invention provides methods for depositing a tungsten nitride layer, especially for applications in which the tungsten nitride is deposited over dielectric surfaces and wherein thin, conformal and adhesive layers are required. Preferred methods involve pulsed nucleation layer (PNL) deposition techniques, which will be described in detail below.

One preferred approach to the PNL process involves first depositing diborane (or other boron-containing precursor) on a substrate surface to form a "sacrificial" boron-containing layer. This sacrificial layer subsequently reacts with a tungsten precursor to form tungsten. The diborane deposition process is not a conventional self-limiting ALD type deposition process. Rather, the diborane reacts on the dielectric surface to decompose into a boron film. The reaction can proceed as long as the substrate is continually exposed to diborane. However, to ensure that a limited amount of tungsten is actually formed in the subsequent step, the diborane deposition is preferably limited to a thickness of between about 3 and 10 angstroms. This may correspond to about one or two monolayers of boron.

Note that the terms boron layer (or "film") and boron-containing layer encompass pure elemental boron as well as various boron compounds such as boron hydride, and mixtures or other combinations of such compounds with each other and/or with elemental boron. The term "elemental boron" as used herein likewise encompasses pure elemental boron as well as combinations of elemental boron with some amount of other material such as any one of many boron-containing compounds.

In the second operation of the process, the boron layer is exposed to a tungsten precursor, which is reduced by the boron to form tungsten. In the third operation, the tungsten layer is converted to tungsten nitride by contact with a nitriding agent. Generally, one wants all of the tungsten to be converted to tungsten nitride. A preferred product is stoichiometric $W_2N$, although WN, $WN_2$, and various other stoichiometries are also covered by this invention. The final film may also contain various hydrides and/or amines, for example. If some amount of tungsten remains unconverted, it can limit the adhesiveness of the layer to the underlying dielectric. Hence, it can be important that the amount of tungsten present in any cycle of the PNL reaction be sufficiently small that it is entirely converted to nitride during the nitriding step. The amount of tungsten produced is limited by the amount of boron that has been previously formed as a sacrificial layer on the underlying substrate. Hence, the amount of diborane deposited and reacted to form boron effectively limits the amount of tungsten, which in turn, ensures that all tungsten can be converted to nitride in a single operation.

After the three operations are completed, a very thin layer of tungsten nitride results. Thereafter, the three operations are repeated in multiple cycles until a desired thickness of tungsten nitride is formed. In subsequent cycles, different reactants can be employed. Most notably, the diborane can be replaced with some other reducing agents such as silane or another silicon hydride.

The process conditions employed at the various steps of the cyclical operation can be widely varied. Relevant process conditions include pressure, temperature, dose, concentration, and time. The nitriding operation offers the most flexibility in choice of these conditions. The diborane operation is preferably performed at a relatively high temperature (e.g., greater than 250 degrees centigrade, preferably between about 200 and 400 degrees centigrade) in order to ensure that a sufficient quantity of boron is formed on the surface in a reasonable amount of time. Regarding other parameters, generally the process steps are performed at a pressure of between about 0.1 and 300 torr and the doses are defined by the flow rates and exposure times. These parameters are described in more detail below.

The PNL process may be preceded by various substrate pretreatments such as a degas operation, an anneal, and/or a preclean, (e.g., a mild sputter etch in argon and/or hydrogen). These pretreatments have various purposes such as desorbing water vapor and removing surface oxidation from electrically active regions of semiconductor devices. They will be described in more detail below. Also, the PNL process may include various post-treatments such as depositing a metallic tungsten layer on top of the tungsten nitride in order to create a WN—W bilayer.

In a typical scenario, the PNL-WN deposition process is preceded by a wafer degas/preheat and preclean. Traditional wafer degas is accomplished with an independent high-vacuum chamber in which the wafer is heated and outgassing species are pumped away. Existing and well know wafer preclean strategies include direct Ar and Ar—$H_2$ sputter etch to physically remove contaminants and surface oxidation prior to barrier deposition.

One implementation of PNL-WN includes an in-situ preheat and reactive wafer preclean. Wafer preheat is used to drive moisture and other contaminants out of the wafer surface. Wafer preclean may be accomplished by brief exposure of the wafer to a tightly controlled dose of atomic or molecular fluorine. In one implementation the fluorine is generated by dissociation of $NF_3$ into F and $N_2$ by means of an inductively coupled plasma (ICP), although other fluorine source gasses (e.g. $F_2$, $CF_4$, $C_2F_6$, $ClF_4$, etc) and other dissociation techniques are equally applicable and within the scope of this invention. The fluorine species generated during wafer preclean react with native oxides and other residues, generating volatile products which desorb from the wafer surface and are pumped away.

In one example, a wafer preclean apparatus includes an $NF_3$ divert line which allows the $NF_3$ flow from a MFC (mass flow controller) to be diverted directly to a process foreline of the deposition chamber until the flow is fully stabilized prior to introduction into the wafer preclean station of the chamber. A parallel outlet valve allows a controlled burst of $NF_3$ to be delivered at the onset of $NF_3$ delivery to the deposition chamber.

As explained below, all gas flow, valve, and plasma source commands may be processed as an embedded input-output controller sequence (IOC sequence) such that the commands are sent as a packet to the IOC and processed in sequence with time control accuracy on the order of +/−10 ms. This tight control of the fluorine dose during wafer preclean assures that the preclean is adequate to remove native oxides and other contaminants from the wafer surface, but not so much that it consumes sensitive materials from the semiconductor wafer surface (such as metal silicide or silicon source-drain contacts, polysilicon contacts, or high-K gate or capacitor dielectrics).

In cases where a fluorine based wafer preclean results in a fluorine saturated semiconductor wafer surface after the clean, various post-clean wafer treatments may be used to scavenge or otherwise remove the fluorine and thereby promote efficient and uniform subsequent PNL-WN growth. Examples of post-clean passivation strategies include the following:

1. Exposure of the wafer surface to atomic and/or molecular hydrogen. The atomic hydrogen may be generated using the same ICP source as described in the preclean description of the preferred implementation above or by another means. The atomic or molecular hydrogen many be delivered with an Ar or $N_2$ carrier gas for example.
2. Exposure of the wafer surface to direct Ar or hydrogen ion bombardment to strip off surface fluorine and fluorides.
3. Exposure of the wafer surface to $WF_6$ prior to exposure to $B_2H_6$ or other reducing agents. The $WF_6$ may substitute for surface fluorine and help promote nucleation on the cleaned surface.
4. Exposure of the surface to $WF_6$ and $B_2H_6$ simultaneously to for CVD-W nuclei.
5. Exposure of the wafer surface to $NH_3$.
6. A combination of numbers 1 and 5 above. Atomic hydrogen exposure converts surface fluorine to HF and $NH_3$ will then generate $NH_4F$. Note that $NH_4F$ volatilizes at temperatures greater than approximately 100 C. A preferred implementation of this process sequence includes wafer heating to about 250 C or more during wafer preheat, preclean, and $H_2/NH_3$ passivation.

In some PNL applications, it may be desirable to provide a four-operation cycle. Here a fourth operation would be reserved for introducing a dopant into the tungsten nitride. So in addition to the steps of exposing the substrate to reducing agent, tungsten precursor and nitriding agent, the process also includes a step of exposing the substrate to a source of dopant. Examples of such dopant sources include phosphine and arsine. It may be appropriate to introduce these separately, rather than together with reducing agent or nitriding agent, because they can be incompatible or possibly explosive in combination with other reactants.

Doping is appropriate to change the properties of the tungsten nitride, particularly its work function. The work function is an electronic property that affects charge distribution in an adjacent layer. Therefore, doping may be pertinent in applications of the present invention relating to creating of a gate electrode or a capacitor electrode. For other applications such as plug fill and barrier layer formation, doping is not a significant concern. In these applications, the barrier property, conformality, thickness, conductivity and adhesiveness of the tungsten nitride layers are most important.

Note that if a tungsten-tungsten nitride bilayer is formed, the metallic tungsten component of this bi-layer can be deposited by either a cyclic PNL process or a bulk CVD process, or some other process if appropriate. CVD has the advantage of producing a lower resistivity film, while PNL has the advantage of producing a more conformal layer without overhang.

Understand that the invention is not limited to PNL processes employing diborane or other boron-containing material. More generally, any suitable reducing agent may be employed. In some cases, the order PNL operations can be varied so that one does not necessarily start with exposure to the reducing agent. In one alternative, for example, the first PNL operation is tungsten precursor absorption. This is followed by reducing agent contact and by nitriding agent contact. Further, the reducing agent and nitriding agent may be provided together in a single operation. Still further, exposure to the reducing agent, the tungsten precursor, and the nitriding agent can be staggered but overlapping in time.

There are many applications of this PNL-WN technology. A few will be described herein. Further, many different process apparatus may be employed. These include both multi-station and single station deposition chambers. When a single station deposition chamber is employed, different precursor gases are provided from the same chamber plumbing. When a multi-station chamber is employed, the apparatus may move the substrate from deposition station to deposition station, with each chamber dedicated to providing a different single reactant. Further, some deposition chambers can be employed for PNL reactions only, while others can be employed for tungsten CVD or other deposition reactions.

Process Flow

A general process flow for the formation of tungsten nitride employed in accordance with this invention is illustrated in the flowchart of FIG. 1. First a substrate surface is provided as indicated at 101. For many embodiments of the invention, the substrate is a semiconductor wafer containing partially fabricated integrated circuitry. It may comprise trenches and/or vias for interconnects or metal lines, as in a Damascene process. Alternatively, it may comprise thin dielectric layers that serve as gate or capacitor dielectrics.

On the substrate surface provided at 101, the process forms a tungsten metal layer. This can be accomplished using one of two methods. In the first method, a reducing agent is initially introduced to the substrate surface (block 103) so that the reducing agent (or a moiety on the reducing agent) is adsorbed or otherwise maintained on the substrate surface. See block 105. As indicated above, some embodiments produce a "sacrificial layer," of reducing agent, particularly when the deposited layer is a boron layer.

More generally, the reducing agent can be any process-compatible compound capable of effectively reducing a tungsten precursor to produce a layer of metallic tungsten. Examples of suitable reducing agents include various boron-containing reducing agents, preferably boranes such as borane (BH3), diborane ($B_2H_6$), triborane, etc. Examples of other boron-containing reducing agents include boron halides (e.g. $BF_3$, $BCl_3$) with hydrogen. Other reducing agents include silicon hydrides such as silane and organic derivatives thereof.

After the layer of reducing agent has formed on the substrate surface, a tungsten-containing precursor gas is introduced to the substrate surface. See block 107. The tungsten-containing precursor is reduced when it comes in contact with the adsorbed sacrificial layer on the substrate surface, forming a tungsten metal layer. Any suitable tungsten-containing precursor that can be reduced by the reducing agent sacrificial layer to produce a layer of tungsten metal in accordance with the invention can be used. Examples of suitable tungsten-containing precursors include $WF_6$, $WCl_6$, $W(CO)_6$, and combinations of these. $WF_6$ has been found to work particularly well with boron sacrificial layers. Various other tungsten precursors known to those of skill in the art may be used. Some of these are identified in R. G. Gordon, J. Barton, and Seigi Suh in *Materials, Technologies, and Reliability for Advanced Interconnects and Low-K Dielectrics II*, edited by S. Lahiri, (Mat. Res. Soc. Proc. 714E, Pittsburgh Pa., 2001), which is incorporated herein by reference for all purposes.

In an alternative method of forming a metallic tungsten layer, the tungsten-containing precursor is introduced to the substrate surface before the reducing agent. See block 111. The tungsten-containing precursor can adsorb onto the substrate surface to form a thin layer of tungsten-containing precursor (or tungsten-containing precursor moiety). See block 113. This process sequence variation may be particularly effective following a fluorine-based wafer preclean.

Suitable tungsten-containing precursors are those can saturate the substrate surface, as by adsorption, and be reduced by a reducing agent to produce a layer of tungsten metal. Generally, the precursors mentioned above ($WF_6$, $WCl_6$, $W(CO)_6$, and combinations) work well.

After the tungsten-containing precursor is provided on the substrate surface, a reducing agent is introduced to the wafer surface. This reduces the adsorbed tungsten-containing precursor layer (block 115), forming a tungsten metal layer. Again, any suitable reducing agent that can reduce the adsorbed tungsten-containing precursor layer to produce a layer of tungsten metal in accordance with the invention can be used. Examples include the boron-containing reducing agents, preferably boranes, more preferably diborane ($B_2H_6$). Other examples include silanes and derivatives of silanes.

Regardless of whether the process employs operations 111, 113 and 115 or 103, 105, and 107, the resulting product is essentially the same: a tungsten layer. At this point, as depicted in FIG. 1, the process flows converge to a single set of operations.

As shown in block 117, an optional hydrogen plasma treatment may be performed to remove the excess halogen byproducts and unreacted halogen reactants. This hydrogen plasma treatment can chemically remove these compounds that are sometimes adsorbed to the surfaces of the substrate and/or reactor walls. They may result from wafer preclean or tungsten precursor dose steps.

Once the tungsten metal layer has been formed and optionally plasma-treated, a nitrogen-containing gas is introduced to the substrate surface to convert at least an upper portion of the tungsten metal to tungsten nitride. See block 119. Examples, of suitable nitrogen-containing gases include $N_2$, $NH_3$, $NF_3$, and $N_2H_4$. At most, this operation completely converts the tungsten layer to tungsten nitride. If the resulting nitride layer is not sufficiently thick for the intended application, the steps described above for tungsten deposition and nitridation can be repeated. If the tungsten nitride is of sufficient thickness, the process is complete. See decision 121.

Certain variations on the above procedure will be apparent. First, the substrate may be pretreated by an anneal or a wafer preclean by sputter etch (Ar or Ar—$H_2$) or a reactive clean (F, $F_2$, $NF_3$, $CF_4$, etc). The preclean may be used to remove native oxides and other contaminants from electrical contacts, or to remove etch residues from contacts or vias. In some situations, it may be possible to enhance PNL-WN adhesion to dielectric substrates by preconditioning them with a light sputter-etch or a reactive fluorine-based etch.

Also, the PNL cycle (111, 113, and 115 or 103, 105, and 107) may be include a dopant introduction operation. A dopant precursor may be included with one of the other three reactants—or alternatively without another reactant. In the alternate case, the PNL cycle will include a separate operation for dopant introduction, so that the overall cycle now comprises four separate operations. Examples of dopants include silicon (from silane for example), phosphorus, arsenic, antimony, bismuth, boron, aluminum, gallium, indium, nitrogen, thallium, and combinations thereof.

Finally, it may be desirable to introduce a purge gas in between the reactant contact operations; e.g., between operations 103 and 105, and/or between operations 105 and 107, and/or between operations 107 and 103. Further, the purge gas can be flowed continuously during any of these operations and during a period or periods between the operations. Purge gases are generally inert. Examples include the noble gases (e.g., argon) and nitrogen.

Hydrogen gas may also be used as a purge or carrier gas. Hydrogen may be used to effectively neutralize residual fluorine from $WF_6$ and to reduce the levels of fluorine or other halogens in the final PNL-WN film. Hydrogen may also be a required co-reactant with some of the dopant precursors described in the previous paragraph.

Deposition Unit Operations

As previously mentioned, methods of the present invention may employ pulsed nucleation layer (PNL) and related deposition techniques. These techniques are used to form tungsten nitride. The following describes a tungsten nitride deposition technique, in accordance with the present invention.

PNL deposition, in general, is a method of sequentially depositing a plurality of atomic-scale layers on a wafer surface by sequentially injecting and removing reactants into and from a chamber. PNL deposition differs from traditional CVD techniques in that the chemical reactant gases are individually injected, sometimes in the form of a pulse, instead of simultaneously injecting reactant gases, so they are not typically mixed in the chamber. For example, in a case of using gases A and B, gas A is first injected into a chamber and the molecules of gas A are chemically or physically adsorbed to the surface of a substrate, thereby forming a saturated layer of A. Typically, the gas A remaining in the chamber is purged using an inert gas. Thereafter, the gas B is injected so that it comes in contact with the adsorbed layer of A and reacts to form a reaction product of A and B. Because the reaction is limited by the amount of adsorbed A, and A is relatively evenly distributed over the substrate surface, excellent step coverage is obtained. B is flowed over the substrate for a period of time sufficient to allow the reaction between A and B to go to completion; i.e., all of the adsorbed A is consumed in the reaction. After that point, residual gas B and any byproducts of the reaction are purged from the chamber. The process is repeated for multiple layers of material to be deposited.

PNL deposition is similar to atomic layer deposition (ALD), which also involves the sequential injection of reactants to a wafer surface. The present invention preferably employs PNL techniques. Generally, however, any ALD or atomic layer epitaxy (ALE) technique may be employed. Some variations of chemical vapor deposition (CVD) may also be used. Both ALD and PNL can use long or short reagent exposure dose times. The resulting microstructure is generally a function of material purity, which is again tunable for both ALD and PNL. While definitions vary slightly and there is certainly considerable overlap between ALD and PNL, one key difference for PNL-W vs ALD-W is that some preferred PNL-W processes typically deposit 3-4 atomic layers of tungsten per complete deposition cycle compared to a single atomic layer (or less) for a more academically inclined ALD process. An operational difference is that pure ALD is typically operated at significantly lower pressures than PNL (mTorr vs 1-100 Torr). Pure ALD may also employ a low-pressure reagent pumping during the reagent purge step rather than relying on inert carrier purge only to sweep leftover reagent from the deposition chamber. Finally, pure ALD generally cannot include reactive carrier gasses such as $H_2$ during the dosing process, as is done with PNL-W and as is planned for PNL-WN. In the specific case of boron-based PNL-WN, $B_2H_6$ deposition (unlike $SiH_4$ or $WF_6$ adsorption) is not a self-limiting process, but rather a real CVD process.

As indicated, tungsten nitride PNL deposition employs a reducing agent, a tungsten precursor, and a nitriding agent, introduced to the wafer surface at different times. The nitriding agent is typically introduced after an elemental tungsten layer has been formed. This layer may be formed by contacting a reducing agent with an adsorbed tungsten precursor or by contacting a tungsten precursor with a sacrificial layer or an adsorbed layer of reducing agent. Either way, chamber-purging operations separate the individual reactant pulses.

One example of a tungsten nitride PNL deposition technique is illustrated in FIGS. 2A-2D. These figures show sequential cross-sectional views of the formation of a tungsten nitride layer on a substrate on a molecular level. Note that these illustrations are cartoon representations to facilitate understanding of PNL deposition. They are shown schematically and are not meant to limit the scope of the invention.

Figure 2A:
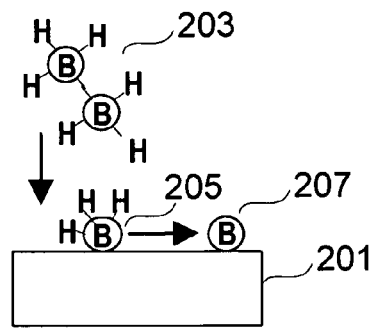
FIGS. 2A-2D are sequential cross-sectional view illustrations of a pulsed nucleation layer deposition mechanism.

Referring first to FIG. 2A, a substrate 201 is exposed to diborane 203. The diborane species is adsorbed onto the substrate surface in the form of $BH_x$ species 205. These $BH_x$ species 205 interact with the substrate surface to form elemental boron species 207. Boron was found to be a particularly good reducing agent for generating tungsten nitride by PNL. Possibly, it interacts with hydroxyl groups on the dielectric surface and strips them off to promote adhesion and nucleation. Also, boron may scavenge or otherwise remove residual fluorine from other processes or low-k dielectrics. Presumably, it forms anchor points and thereby promotes good adhesion of the tungsten to the underlying dielectric layer.

At temperatures greater than about 250 degrees C., the borane species rapidly decompose to form elemental boron. This boron generation process continues as long as there is boron precursor present and a driving force for the decomposition reaction. The reaction proceeds well on dielectric such as silicon dioxide and low k dielectrics, for example. As indicated, the resulting elemental boron layer is sometimes called a "sacrificial layer."

The formation of the boron sacrificial layer is not a self-limiting reaction. The boron can accumulate to thicknesses well in excess of one atomic layer. Therefore, exposure to diborane 203 should be limited to a point where the desired thickness of boron is achieved. Typically, desired thickness is about one to two monolayers of boron species. Preferably, the thickness is less than about 10 angstroms, more preferably between about 3 and 10 angstroms.

During the formation of a boron sacrificial layer, suitable diborane gas pressures range from about 0.1 and 300 Torr, more preferably between about 1 and 100 Torr, and most preferably between about 1 and 40 Torr. This may apply for reducing agents other than diborane, as well. Preferably, the substrate temperature is at least about 300 degrees C. More preferably, it ranges from about 300 and 500 C, and even more preferably between about 350 and 400 C. In a specific example, diborane is provided at a flow rate of about 200 sccm (per station) for a period between about 0.5 and 3 seconds. A 2 second purge is then applied, for example, prior to introduction of tungsten precursor.

Figure 2B:
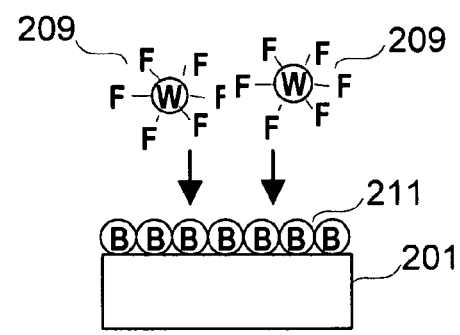
Figure 2C:
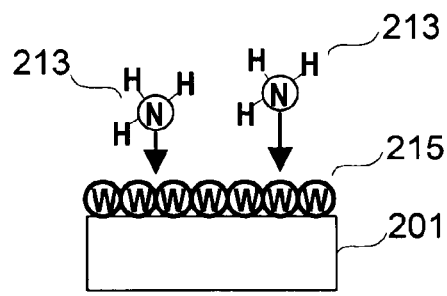
Figure 2D:
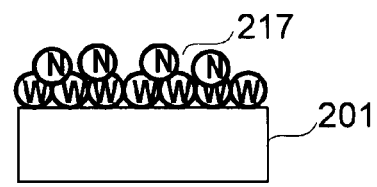

Referring to FIG. 2B, once the boron sacrificial layer 211 is formed to the desired thickness, the substrate surface 201 is exposed to tungsten hexafluoride (WF$_6$) gas 209 or other suitable precursor. The tungsten hexafluoride 209 species are reduced when they come in contact with the boron sacrificial layer, thereby forming a thin tungsten metal layer. See layer 215 of FIG. 2C. The thickness of this tungsten metal layer is limited to the amount that can be produced by reaction of the boron sacrificial layer. Note that it may be desirable to limit the amount of WF$_6$ to prevent too much exposure to this fluorinated agent, as the fluorine can attack exposed silicon oxides or other features of the substrate. Hence, the boron thickness is limited as indicated above. An inert gas such as argon can be used to dilute the byproducts and remove species that are already in mobile gas phase in the reactor.

As stated previously, in some embodiments, the surface of the newly formed tungsten metal layer may also be treated with hydrogen plasma to help remove chemical byproducts. The length of time for exposure to hydrogen plasma is sufficient to remove enough halogen byproduct and unreacted precursor that they will not react with or interfere with the reactants introduced in the next deposition cycle. If a hydrogen plasma treatment is used, it is preferred that the hydrogen plasma pulses are between about 0.1 and 30 seconds in duration.

During the reduction reaction of the tungsten-containing precursor with the boron sacrificial layer, suitable gas pressures are as set forth above for depositing the reducing agent. Suitable process temperatures range from about 200 and 450 C, more preferably between about 250 and 350 C. In a specific embodiment, tungsten hexafluoride is provided at a flow rate of about 150 sccm (per station) for a period of between about 0.25 and 3 seconds. This is followed by an inert gas purge of about 2 seconds, for example.

Referring again to FIG. 2C, once the tungsten metal layer is formed and sufficiently cleaned of byproducts, a nitriding agent in the form of NH$_3$ 213 is introduced to the substrate surface. In this example, the tungsten metal layer is approximately one monolayer thick, resulting in a tungsten nitride that is also approximately one monolayer thick. The tungsten nitride is shown as layer 217 in FIG. 2D. If the tungsten metal layer is more than one monolayer thick, the reaction may be controlled such that only the upper portion of the tungsten metal is converted to tungsten nitride. In some embodiments, it is preferred that the tungsten be fully converted to tungsten nitride, as tungsten nitride adheres to dielectric much more strongly than elemental tungsten adheres to dielectric. This provides another reason to limit the thickness of tungsten formed during the B$_2$H$_6$—WF$_6$ reaction. As stated previously, if a thicker layer of tungsten nitride is desired, the steps shown in FIGS. 2A-2D can be repeated until the desired thickness is achieved.

During the nitridation reaction, suitable gas pressures are as described above for the reducing agent. Suitable process temperatures range from about 200 and 450 C, more preferably between about 300 and 400 C. The nitrogen containing gas may be converted, at least partially, to a plasma, which is, in one embodiment, directed to the substrate by biasing the substrate with an RF powered electrode. Further, the process may employ an ultraviolet radiation source or other energizing stimulus to facilitate the nitriding reaction. In a specific embodiment, ammonia is provided at a flow rate of about 250 sccm (per station) for a period of between about 1 and 10 seconds. This is followed by a purge of about 2 seconds, for example.

Not shown in FIGS. 2A-2D is a dopant deposition unit operation. Such operation is optional, depending upon the application of the tungsten nitride layer. If a separate dopant deposition operation is employed, it may employ a pressure matching one of those set forth above for the reducing agent. In addition, it may employ a substrate temperature suitable for driving the reaction that converts and dopant precursor to elemental dopant. The flow rate and exposure time are chosen to meet the level of doping required in the final product. Examples of precursor compounds include B$_2$H$_6$, NH$_3$, SiH$_4$, phosphine and arsine.

As indicated, one aspect of the current invention provides inclusion of a thin layer of tungsten deposited by PNL or other means prior to the first deposition of PNL-WN. In one implementation, this is accomplished by simply suppressing the nitridation sequence of the PNL-WN process for the first few deposition cycles. After the W seed layer is deposited, the PNL-WN process continues without vacuum break to deposit the desired total amount of PNL-WN and possibly PNL-W nucleation and CVD-W.

The inventors have observed that they can achieve a significant enhancement in adhesion on dielectrics by introducing a thin (<50 Å and preferably about 10-50 Å) tungsten seed layer prior to deposition of PNL-WN. Possible mechanisms for this improvement include but are not limited to a change in the stoichiometry of the WN film at the WN-dielectric interface to a more perfect W2N composition if the intrinsic PNL-WN process is nitrogen-rich. X-ray diffraction studies have shown that films with more pronounced W2N microstructure have better adhesion.

The thin tungsten seed may also be available for reaction with the metal silicide or silicon at the base of a contact, bitline, or other structure. The resulting tungsten silicide is able to reduce the electrical resistance of a WN-silicide (NiSix, CoSix, TiSix) or WN—Si (N+, P+, poly-Si) interface much like titanium does in current tungsten metallization schemes. The tungsten seed can react with silicon to form silicide at temperatures greater than about 500 C (preferably between about 550 and 650 C). Thus, this thin tungsten silicide interfacial layer can be of great benefit in reducing contact resistance of tungsten and tungsten nitride contacts to silicon or metal silicides when the traditional Ti—TiN—W film stack has been replaced by a W-seed/PNL-WN/PNL-W/CVD-W film stack. The thin tungsten seed is readily converted to tungsten silicide at temperatures greater than about 550 C, which can dramatically lower the resistance of the WN—Si interface. (PNL-WN, on the other hand, is resistant to reaction with silicon until reaching temperatures greater than approximately 750 C.) The tungsten seed embodiment enables the formation of a thin and readily controllable tungsten silicide layer for reduced contact resistance.

In another approach, the invention provides alternating layers of PNL-WN and tungsten. When the layers are very thin (preferably less than about 10 Å each) the layered structure can self-anneal into a more tungsten-rich form of tungsten nitride. By utilizing the wide stoichiometry control offered by layered WN—W deposition it is possible to modulate the work function of the composite material. This is very important for both gate electrode and capacitor electrode applications. It may also be beneficial in improving the thermal stability of the final film by chemically binding excess nitrogen into a stable tungsten nitride stoichiometry such as W2N.

It may also be desirable to create layered structures beginning with either PNL-WN or PNL-W. In a preferred embodiment, the layered structure begins and ends with tungsten.

It may be advantageous to perform the PNL-WN deposition in a hydrogen-argon ambient or other fluorine scavenging environment. It is important to the success of many applications to create a PNL-WN film with very low fluorine content. One strategy by which this objective can be achieved is to use an Ar—$H_2$ carrier gas mixture. The $H_2$ reacts with free fluorine to generate HF that can be effectively pumped away for the semiconductor wafer. In one preferred embodiment the Ar—$H_2$ carrier gas mixture is roughly 50% hydrogen.

Applications

Below are descriptions of various exemplary applications of the present invention. Note that these descriptions are presented only as examples. They are not meant to exclude other applications of the invention. Nor are they meant to exclude the use of the invention from variations or combinations of methods described.

Application 1: Copper Diffusion Barrier

Damascene fabrication processes may employ tungsten nitrides as a copper diffusion barrier. It has also been found that the tungsten nitride layer serves a second function: as an adhesion layer for the copper metallization layer.

The copper metallization layer may comprise two components: a first thin seed layer and a second electrolytic bulk copper layer. The seed layer may be deposited by physical vapor deposition (PVD), CVD, ALD, or electroless deposition, for example. Electroless deposition may be accomplished with appropriate plating solutions, including a source of copper ions, a reducing agent, and in some cases a base to render the solution alkaline. Preferably the PVD process is performed with a hollow cathode magnetron, but other PVD apparatus may be employed as well.

The tungsten nitride is deposited by PNL or ALD as described above. The copper seed layer may be formed directly on the nitride or indirectly via a metallic tungsten layer. If a metallic tungsten layer is employed, a stack comprised of dielectric, tungsten nitride, metallic tungsten, and copper results. The metallic tungsten may be formed by PNL, ALD, CVD or a combination of these processes.

The following list presents numerous process options.

1. PNL WNx-PNLW-CVDW (two step tungsten deposition)-HCM-Cu seed (HCM=hollow cathode magnetron)— followed by electrolytic copper plating
2. PNL WNx-PNLW-HCM-Cu seed—followed by electrolytic copper plating
3. PNL WNx-CVDW-HCM-Cu seed—followed by electrolytic copper plating
4. PNL WNx-HCM-Cu seed—followed by electrolytic copper plating
5. PNL WNx-PNLW-CVDW—followed by electroless copper seed and electrolytic Cu fill
6. PNL WNx-PNLW followed by electroless copper seed and electrolytic Cu fill
7. PNL WNx followed by electroless copper seed and electrolytic Cu fill In each case, PNL-WNx serves as an adhesion layer. PNL-WNx and/or PNL-W can both serve as copper barriers. Advantages of WN—W barriers over conventional barriers such as Ta—TaN include conformality (100% in >10:1 AR contacts) and improved electromigration resistance due to improved tungsten-copper bonding.

For integration schemes in which WN—W is not integrated with copper seed deposition (in a single vacuum integrated tool), native oxide can be removed from the W surface by argon or argon-hydrogen ion bombardment. After cleaning, W—Cu adhesion is dramatically improved for non-vacuum integrated W—Cu.

Note that options 1 and 5 include a two-step tungsten deposition process, including both CVD and PNL deposition processes. This may be done because CVD deposited films generally have a low resistivity, while PNL deposited films have good step coverage.

Note that for options 5-7 above, a PNL-WN/PNL-W stack is the preferred implementation because direct plating is more favorable on a tungsten surface than on tungsten nitride. Direct plating on a tungsten/tungsten nitride barrier stack is also most preferably carried out in a basic plating solution to facilitate the removal of native tungsten oxide from the Cu—W interface by solvation of tungsten oxide.

Application 2: Tungsten Plugfill

The PNL tungsten nitride deposition method of this invention can also be used in processes for generating tungsten plugs for contact or via fill in IC wafer fabrication. The tungsten nitride layer serves as a diffusion barrier and adhesion layer for the tungsten contact. The PNL WN barrier and/or adhesion layer for direct tungsten plugfill contacts tungsten, metal silicides (such as $TiSi_x$, $CoSi_x$, $NiSi_x$, or $WSi_x$), silicon (N+ or P+), or other electrically conductive materials. It may also be preferably combined in an integrated contact plug film stack including PNL-W (seed layer)/PNL-WN (barrier-adhesion layer)/PNL-W (nucleation layer)/CVD-W (primary conductor and bulk plugfill). This proposed tungsten plugfill integration scheme is intended to replace the traditional Ti/TiN/W tungsten plugfill film stack.

In current semiconductor metallization schemes for 90-nm and higher device geometries, tungsten is used as a primary conductor for many contact and via applications. The typical film stack in use today is PVD-Ti/CVD-TiN/W nucleation/CVD-W. With PNL-WN it is possible to simplify this film stack to PNL-WN/PNL-W (nucleation)/CVD-W. This application of PNL-WN has many advantages over current practices in the industry. First, by eliminating the need for Ti—TiN semiconductor manufacturers are able to eliminate an entire tool set, greatly simplifying the process flow and reducing the cost to manufacture semiconductor devices. The process temperatures for PNL-WN and PNL-W are (approximately) <400 C and <300 C in a typical implementation, compared to >500 C for CVD TiN from $TiCl_4$ or >450 C for CVD-TiN from TDMAT. This reduction in processing temperature allows advanced manufacturers of logic and memory devices to move from titanium and cobalt silicide metal contacts to nickel silicide, which undergoes a phase change to a new phase with dramatically higher electrical resistance at temperatures above 450 C. Elimination of PVD-Ti in the tungsten metallization stack eliminates the overhang associated with all PVD processes at the mouth of a contact or via. This creates an intrinsically re-entrant feature which leads to center seam formation during subsequent filling of the cylindrical contacts or vias with CVD-W. By eliminating the overhang by replacing Ti—TiN with PNL-WN, no overhang is created at the feature opening prior to CVD-W and the resulting center seam is reduced. Such seams can be opened during CMP of the tungsten film to complete the tungsten metallization. Finally, by reducing the total thickness of liner barrier required inside a contact or via prior to CVD-W, PNL-WN implementation enables a reduction in contact or via resistance compared to the traditional PVD-Ti/CVD-TiN/CVD-W film stack. This reduction in resistance comes about because a larger percentage of the contact or vias cross section is available for deposition of low resistivity tungsten rather than higher resistivity Ti and TiN.

To recap, some advantages of the tungsten nitride plugfill integration scheme over the traditional Ti—TiN integration scheme are as follows:
1) The ability of the PNL-WN/PNL-W processes to fill contacts and vias with aspect ratios greater than 20:1. This is a significant advance over traditional CVD-TiN and PVD-Ti step coverage performance
2) Elimination of Ti—TiN deposition equipment and processing steps. This simplification will substantially reduce the manufacturing cost of the tungsten plugfill process. In a preferred implementation wafer preclean, PNL-WN, PNL-W, and CVD-W are all completed in a single wafer pass through an integrated cluster tool. This saves on wafer moves from tool to tool, semiconductor cleanroom floor space requirements, and semiconductor manufacturing capital equipment cost by eliminating the Ti—TiN deposition tool.
3) Reduction in semiconductor wafer maximum processing temperature requirements. Modern semiconductor wafer processing thermal budget requirements call for maximum processing temperatures <450 C for contact metallization and <350 C for vias in low-K dielectrics. PNL-WN and PNL-W are both typically deposited with wafer temperatures <300 C in the preferred implementation.
4) Reduction in post-CMP center seam opening (or coring) of tungsten plugs. As tungsten grows from the sides of a contact or via to the center, a thin seam is typically left at the centerline of the plug. In the case of a Ti—TiN liner barrier stack, the relatively poor step coverage of (PVD) Ti and (CVD) TiN result in an overhang feature at the mouth of the contact. This can result in a feature with a smaller diameter at the top than in the mid-section of the plug. Such an overhang inevitably produces an open seam inside the plug because the growing tungsten film seals the top of the feature before the midsection of the feature is completely filled. Such seams can be exposed during CMP and result in wafer defects. In the case of a PNL-WN/PNL-W liner-barrier film stack, both materials have virtually 100% step coverage and can be deposited very thinly (<50 Angstroms), which results in no overhang and no resulting seam during CVD plugfill.
5) By reducing the total thickness of the liner barrier layer from, say, 200 Angstroms for a typical Ti—TiN implementation to <50 Angstroms for PNL-WN (in the preferred implementation), it is possible to fill the contact or via with a greater amount of CVD-W, which is the primary conductor and significantly lower in resistivity than PVD-Ti, CVD-TiN, or PNL-WN. This can reduce the electrical resistance of the contact or via for small diameter contacts where the liner barrier film thickness is an appreciable percentage of the feature radius.

In this invention, PNL tungsten nitride can be formed in the vias or contact holes directly on the dielectric or with a PNL-W seed layer. The tungsten may be deposited by PNL, ALD, CVD, or a combination of these. Also, the process may be integrated with a degas and/or preclean operation (e.g., a plasma etch) prior to the PNL tungsten nitride deposition. In some cases it may be advantageous to create a combined TiN/WN barrier layer.

The reactor employed for this application may support single-wafer processing or multi-station sequential deposition, with tungsten nitride PNL and tungsten CVD integrated in a single module. In the preferred implementation wafer pre-heat, preclean, and PNL-WN deposition are combined in a one multi-station process module and a second process module is dedicated to the deposition of PNL-W and CVD-W. In some situations wafer preheat/degas, and wafer preclean may each be given independent process modules on an integrated cluster tool to provide greater process flexibility.

Exemplary process flows include the following:
1. PNL WN-PNLW nucleation layer-CVD-W plugfill
2. PNL-W seed/PNL-WN barrier adhesion/PNL-W nucleation/CVD-W bulk plugfill
3. preheat/wafer preclean/PNL-W seed/PNL-WN barrier-adhesion/PNL-W nucleation/CVD-W plugfill
4. PNL WN-CVD-W plugfill
5. WN—W integrated with degas, preclean (DFE or reactive clean)
6. WN—W integrated with degas, preclean (DFE or reactive clean) and HCM-Ti (a thin titanium layer deposited via a hollow cathode magnetron).

Note that "DFE" is Dual Frequency Etch. As an example, Novellus' INOVA wafer preclean (Novellus Systems, Inc., San Jose, Calif.) uses Ar ions from a dual frequency inductive plasma to provide high plasma density (high frequency component) and independently controllable ion acceleration (low frequency component).

Application 3: Capacitor Electrode

Current DRAM capacitor electrodes making use of TiN/polysilicon electrodes suffer from the high deposition temperatures of both CVD-TiN (>500° C. from $TiCl_4$) and polysilicon CVD (>600° C. from $SiH_4$). These high deposition temperatures drive reaction byproducts into the capacitor dielectric and in so doing reduce the dielectric constant of the dielectric and the capacitance of the resulting storage capacitor. High step coverage is an absolute requirement in advanced memory cell electrode formation, and the near 100% step coverage of PNL-WN in features with aspect ratios >15:1 is far superior to previous CVD and PVD tungsten nitride processes. Based on literature reports, the work functions of WN and W are in the 4 to 4.5 eV range, which is significantly higher than typical CVD-TiN work functions (2.2 eV). High electrode work functions are known to reduce leakage in memory cell capacitors.

In this application, the PNL deposited tungsten nitride layer is used as a metal electrode either alone or in a PNL-WN/PNL-W film stack. More generally, the tungsten nitride layer can function as an adhesion layer, barrier layer, and/or as a primary electrical conductor for a top or bottom capacitor electrode. Again, the tungsten may be deposited by PNL, ALD, CVD, or a combination thereof. Degas and/or preclean may be employed. And single wafer processing or multi-station sequential deposition may be employed.

Note that integrated circuit capacitor electrodes are currently made from film stack of CVD-TiN and highly doped polysilicon. The deposition temperatures for $TiCl_4$-based CVD-TiN and poly silicon are >550 C and >600 C, respectively. These high temperatures result in the driving of impurities into the capacitor dielectric (e.g. Cl) and the oxidation of the TiN barrier layer, both of which reduce capacitance and increase capacitor leakage. A WN—W capacitor electrode can dramatically reduce the manufacturing thermal cycles with resulting leakage reductions and improvements or post anneal capacitance for comparable leakage. The following process flows can be used to deposit top or bottom capacitor electrodes.
1) PNL WN/PNLW nucleation layer/CVD-W
2) PNL-W/PNL-WN/PNL-W/CVD-W
3) PNL WN-CVD-W plugfill
4) WN—W integrated with degas, preclean (DFE or reactive clean)

The capacitors may be trench capacitors, fin capacitors, plate capacitors or any other structure suitable for IC applications. In the case of stacked capacitors the bottom electrode may be deposited on a polysilicon bottom electrode to facilitate structure formation. The extremely high step coverage of PNL-WN and PNL-W are enabling features required for implementation of PNL-WN for modern semiconductor memory cell electrodes.

Application 4: Gate Electrode

In this application, tungsten nitride functions as an adhesion layer, barrier layer, or primary conductor in a gate electrode. Tungsten nitride may be applied directly on the gate dielectric or on a polysilicon electrode to reduce polysilicon line thickness requirements.

Some of requirements for a transistor gate application include a tunable work function, thermal stability, and resistance to oxidation. Modifying the W/N stoichiometry of the as-deposited film, or adding dopants such as boron (from diborane for example), silicon (from silane for example) and/or nitrogen (from ammonia for example) can tune the work function of PNL tungsten nitride. In addition to boron and nitrogen, typical III-V dopant materials such as Al, Ga, P, and As may also be employed. Another effective way to modulate the work function of PNL-WN is to generate a layered structure of PNL-WN and PNL-W. The number, thickness, and sequence of the layers can be varied, but the preferred implementation is for very thin (<10 Å) layers of alternating PNL-W and PNL-WN, beginning and ending with PNL-W.

As a gate electrode, a PNL tungsten nitride or a tungsten-nitride/tungsten film stack provides a metal gate that resists the charge depletion phenomenon commonly observed in non-metallic gate electrodes such as those fabricated from polysilicon. Charge depletion effectively increases the gate dielectric thickness. A tungsten-nitride/tungsten gate electrode may also be formed on top of a polysilicon gate electrode to reduce the height requirement of the polysilicon gate without changing the gate dielectric/polysilicon interface.

As discussed above, it may be valuable to fabricate layered PNL-W/PNL-WN gate electrode structures to facilitate work function modulations for mixed N+ and P+ transistor devices.

Various possible process flow implementations include
1) PNL-WN-PNL-W-CVD-W bulk deposition and interconnect
2) Layered PNL-W/PNL-WN/CVD-W bulk deposition and interconnect
3) PNL-WN/PNL-W gate electrode with poly-Si plug and interconnect
4) PNL-WN/PNL-W/CVD-W on a thin poly-Si gate electrode for reduced poly-Si thickness requirement.
5) PNL WN-CVD-W plugfill.

Tool configuration options include
1) WN—W integrated with degas, preclean (DFE or reactive clean) and
2) single-wafer processing or multi-station sequential deposition with WN, PNL and WCVD integrated in a single module.

Application 5: Other Uses

In one application, PNL WN serves as a barrier and adhesion layer for the deposition of bitline or wordline local interconnects in DRAM devices. In another application it serves as an adhesion layer for W deposition on oxide in semiconductor applications such as light shield for CCD devices. Still further, PNL WN may serve as a hardmask for patterning low-K dielectrics. A WN—W stack can be deposited at lower temperature and with less exposure of photoresist to harmful amines than conventional PECVD SiN hardmasks. Many other applications will occur to those of skill in the art.

Deposition Apparatus

The methods of the invention may be carried out in any number of process chambers. Examples include the Novellus Systems Concept 2 Altus chamber, the Novellus Concept 3 Altus processing chamber, or any of a variety of other commercially available CVD tools. In some cases, the reactor contains multiple deposition stations in which parallel reactions can take place. See, e.g., U.S. Pat. No. 6,143,082, which is incorporated herein by reference for all purposes. Thus, in some embodiments, the pulsed nucleation process is performed at a first station that is one of multiple deposition stations provided within a single deposition chamber. Thus, the reducing gases, tungsten-containing precursor gases and nitridation gases are alternately introduced to the surface of the semiconductor substrate, at the first station, using an individual gas supply system that creates a localized atmosphere at the substrate surface. Between the successive exposures to reactant gases, the chamber is purged using an inert gas or an inert gas in conjunction with hydrogen. This process may take place in parallel at the multiple deposition stations. Alternatively, or in addition, some stations can be reserved for PNL deposition of tungsten nitride while others are reserved for PNL or CVD formation of tungsten. In such cases, the PNL deposition of tungsten nitride may take place at one or more stations. After the required PNL cycles are completed to deposit the full thickness of nitride, the substrate is moved to a different station where metallic tungsten is deposited on the new tungsten nitride layer. In a preferred implementation PNL-WN (including tungsten seed layer formation) is deposited in a dedicated process module and PNL-W and CVD-W are deposited in another process module on a vacuum integrated cluster tool.

In other embodiments, the semiconductor substrate is moved between different deposition stations during a single PNL deposition cycle. In this approach, different stations are dedicated to different processes within the cycle. For example, one or two stations might provide reducing agent, one or two other stations might provide tungsten precursor and still other stations might provide nitriding agent. And in some embodiments, certain stations can be reserved for providing dopant precursors. The various stations can also provide for the simultaneous delivery of inert gases with the dedicated gases. Overall, tungsten nitride is deposited by moving wafers from station to station such that the wafer is sequentially exposed to the reducing gases, then the tungsten-containing precursor gases, then nitridation gases, repeatedly until the desired thickness of tungsten is obtained.

In any of these scenarios, the wafers may be indexed from one deposition station to the next to enable parallel wafer processing. Indexing continues until all substrates are coated to the desired thickness. Any number of deposition stations, each capable of having a localized atmosphere isolated from adjacent stations, is possible within the single chamber.

As will be appreciated in the art, each such deposition station will typically have a heated substrate platen for holding and heating a substrate to a predetermined temperature. In addition, each may have a backside gas distribution system to prevent deposition of the W film on the backside of the substrate, and a vacuum clamping manifold for clamping the substrate to the platen. Finally, the deposition chamber can be equipped with a transport system for transporting wafers or substrates into and out of the chamber as well as between deposition stations.

Another aspect of the invention provides a module containing one or more of the following design elements for alternating deposition of tungsten nitride and/or stacks comprising tungsten nitride and tungsten:

a plurality of deposition stations comprising a showerhead or dispersion plate for uniform gas introduction paired with a heated pedestal that holds a wafer underneath the showerhead;

a plurality of deposition stations with showerheads flush-mounted with the top of the module vacuum chamber to minimize gas re-circulation in the module and promote efficient purging between alternating deposition steps;

a fully purged top plate of the module vacuum chamber consisting of a purge gas plenum covering the top plate area not occupied by deposition showerheads wherein improved station-to-station isolation and reduced purge times between deposition cycles are obtained; or a vacuum chamber in which the heated pedestals from each deposition station are completely or partially isolated from each other by an annular pumping ring connected to the chamber exhaust. This feature further enhances station-to-station isolation and enables different processes to be run simultaneously on alternate stations in the same module.

The module may further comprise a mechanism, provided to each showerhead, for creating a RF plasma in between the showerheads and the substrate platens. Preferably, such means comprise an RF energy source, a match network, and the necessary electrical connections. In another embodiment, the module may further comprise means for creating a remote plasma in the chamber. Some modules may provide a divert line connected directly to the process vacuum exhaust (pump or vacuum foreline) such that process gasses can bypass the deposition chamber during the time immediately after their respective mass flow controllers (MFCs) are turned on. In addition, the gas delivery system may be provided with a mechanism for controlling the line charge volume. This can be important in precisely timing delivery of nitriding agent, tungsten precursor (e.g., $WF_6$), and/or reducing agent (e.g., $SiH_4$ and $B_2H_6$). With such hardware features, all gasses that pulse on and off during PNL can be delivered with a divert and line charge process sequence.

Figure 3:
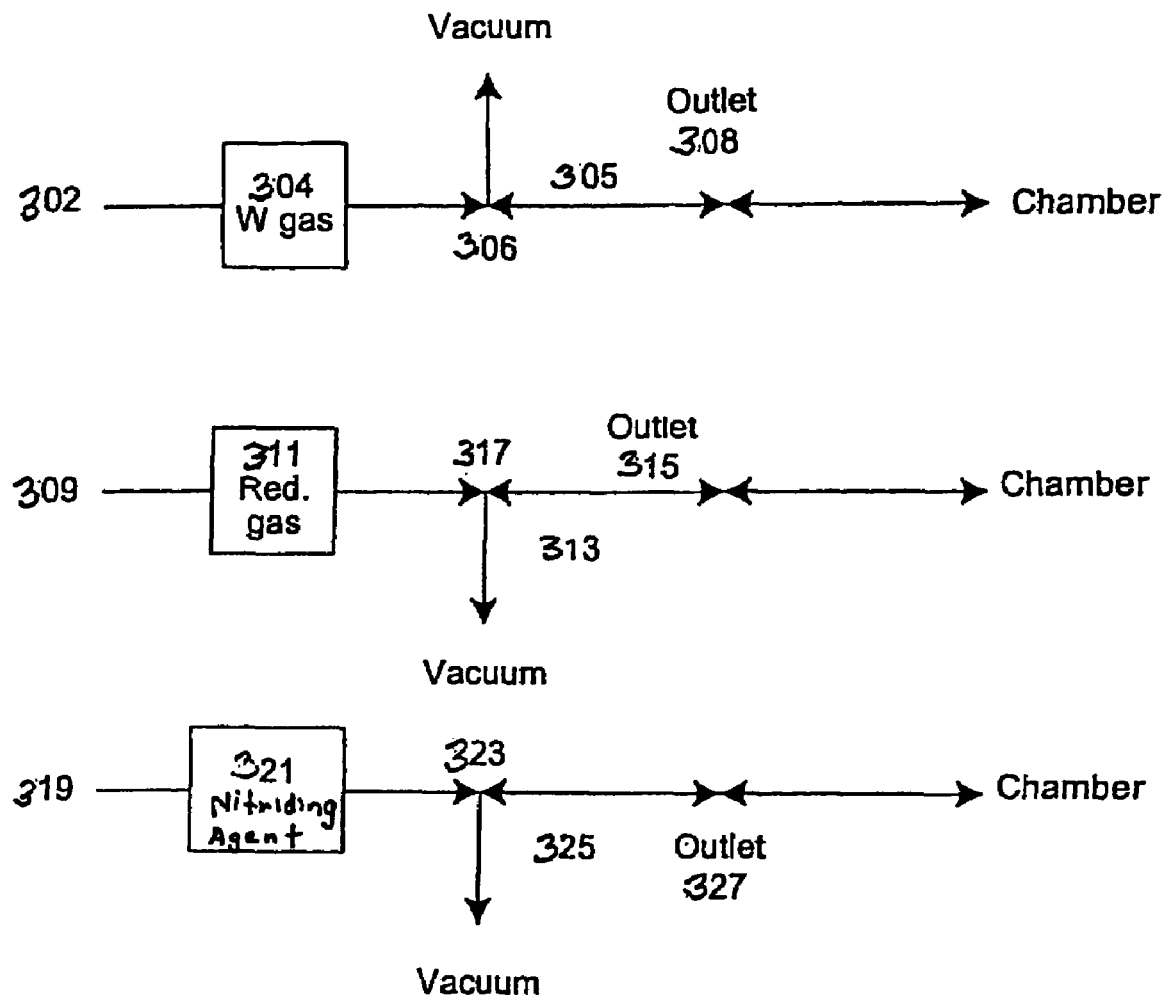
FIG. 3 is a schematic diagram showing the basic features of an apparatus suitable for practicing the current invention.

The invention may be implemented using a gas manifold system, which provides line charges to the various gas distribution lines as shown schematically in FIG. 3. Manifold 304 has an input 302 from a source of the tungsten-containing precursor gas (not shown), manifold 311 has an input 309 from a source of diborane or other reducing gas (not shown) and manifold 319 has an input 321 from a source of nitriding agent (not shown). The manifolds, 304, 311 and 321 provide the tungsten-containing precursor gas, reducing gas and nitriding agent to the deposition chamber through valved distribution lines, 305, 313 and 325 respectively. The various valves are opened or closed to provide a line charge, i.e., to pressurize the distribution lines. For example, to pressurize distribution line 305, valve 306 is closed to vacuum and valve 308 is closed. After a suitable increment of time, valve 308 is opened (valve 315 is closed) and the tungsten-containing precursor gas is delivered to the chamber. After a suitable time for delivery of the gas, valve 308 is closed. The chamber can then be purged to a vacuum by opening of valve 306 to vacuum.

Similar processes are used to deliver the reducing gas and the nitriding agent. To introduce the reducing gas, for example, distribution line 313 is charged by closing valve 315 and closing valve 317 to vacuum. Opening of valve 315 allows for delivery of the reducing gas to the chamber. Similarly, to introduce the nitrding agent, distribution line 325 is charged by closing valve 327 and closing valve 323 to vacuum. Opening of valve 327 allows for delivery of the ammonia or other nitriding agent to the chamber. It has been found that the amount of time allowed for line charges changes the amount and timing of the initial delivery of the gas. Some examples of suitable line charge times are presented below.

FIG. 3 also shows vacuum pumps in which valves 306, 317 and 323, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

If the process employs both a boron-containing reducing agent and a silane reducing agent, there may be two subsystems for the reducing agent: one for the boron-containing reducing agent and another for the silane.

Note that the PNL processes described above may require precise timing of valves and mass flow controllers (MFCs) supplying pulses of reagent to the semiconductor substrate during PNL-WN deposition. In one way to make this possible, valve and MFC commands are delivered to embedded digital input-output controllers (IOC) in discrete packets of information containing instructions for all time-critical commands for all or a part of a PNL deposition sequence. The C2 and C3 ALTUS systems of Novellus Systems, Inc. provide at least one IOC sequence. The IOCs can be physically located at various points in the apparatus; e.g., within the process module or on a stand-alone power rack standing some distance away from the process module. There are typically multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, PNL to run at stations 1-2 with all timing controlled for all the hardware components needed to deposit PNL-WN at those stations. A second sequence might be running concurrently to deposit CVD-W at other deposition stations in the same module. The relative timing of the devices controlling the delivery of reagents to stations 3-5 is important within that group of devices, but the relative timing of the PNL process at stations 1-2 can be offset from the relative timing of CVD at stations 3-5. An IOC translates the information in a packetized sequence and delivers digital or analog command signals directly to MFC or pneumatic solenoid banks controlling the valves. This implementation reduces delays in command execution at the valve or MFC to as little as 5 ms. Typical control systems in which commands are issued one by one to the IOC are subject to communication delays between the computer controlling module operation and the IOC. Delays in the single-command implementation can exceed 250 ms.

In one example, to achieve good response and repeatability, the nitriding agent flow may be introduced by first enabling flow through a nitriding agent Mass Flow Controller (MFC) and diverting the flow to a process vacuum pump to stabilize flow before introducing the agent into the deposition chamber. To stabilize the nitriding agent flow, the outlet valve 327 is closed while divert valve 323 is open. The manifold system then pressurizes delivery line 325 to assure a controlled initial burst of nitriding agent by closing the divert valve 323 with the process outlet valve 327 closed for between about 0.10 and 3.00 seconds. Next, the system opens the outlet valve 327 to the deposition chamber with the divert valve closed to deliver nitriding agent to the process chamber during deposition. Preferably, all valve timing is controlled using an embedded input-output controller command sequence as described above. The above process may be applied to deposition of tungsten nucleation layers, bulk layers, and/or cap layers, using PNL or CVD.

One manifold system sequence for delivering a boron-containing gas (e.g., diborane) to the chamber involves the following operations. First, the system divert a diborane-carrier gas mixture to a vacuum pump for a period of time while the MFC or other flow controlling device stabilizes. Preferably, this is done for between about 0.5 and 5 seconds using a mixture of 5% by volume diborane in a nitrogen carrier gas. Next the system pressurizes the diborane delivery manifold by closing both the divert valve and the outlet to the deposition chamber. In one implementation, this is done for a period of time between about 0.1 to 5 seconds. This creates an initial burst of reagent when the outlet to the deposition chamber is opened. In one implementation, the outlet valve is opened for a period of between about 0.1 to 10 seconds. This is then followed by purging diborane from the chamber using a suitable carrier gas.

A pulse of tungsten-containing gas may be generated as follows. Initially, the system diverts $WF_6$ (an example of the gas) to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 306 and the outlet 308 to the deposition chamber. This may be done for a period of between about 0.1 and 5 seconds, for example, to create an initial burst of reagent when the outlet to the deposition chamber is opened. This is accomplished by opening outlet valve 308 for between about 0.1 and 10 seconds in one example. Thereafter, the tungsten-containing gas is purged from the deposition chamber using a suitable purge gas.

The pulsed flow of silane or other reducing gas may be implemented in a similar manner by controlling divert valve 317 and outlet valve 315. The divert, line pressurization, and flow steps may be timed as presented above for the tungsten-containing gas example. After pulsing with reducing gas for a period of between about 0.1 and 10 seconds, outlet valve 315 is closed and a purge gas is flowed through the chamber.

A listing of hardware elements that may be employed in accordance with the present invention follows. Some of these were identified above.

1) A fully heated and insulated PNL-WN process module such that all internal surfaces are maintained at 100 C or above to avoid condensation of NH4F, a byproduct of the B2H6-WF6-NH3 reaction.
2) A system of gas manifolds such that a single reagent MFC (paired with an inert carrier gas MFC) is split to supply this reagent to multiple deposition stations. This implementation effectively reduces hardware cost by sharing components across multiple deposition stations. It also reduces wafer to wafer and station to station variability by supplying multiple stations from a single source
3) A system with shared reagent manifolds as discussed above (#2) in which each outlet of the manifold to a deposition station is individually valved. This enables the user to select whether or not a given reagent should be delivered to a specific deposition station during a given deposition cycle. This further enhances the ability of the tool to deliver layered films with multiple compositions. For example, the ammonia outlet at the first deposition station may be closed for one or more deposition cycles to promote the growth of a thin tungsten seed (from B2H6-WF6 reaction).
4) Inclusion backside gas delivery hardware to deliver Ar, H2 and NH3 through heated wafer susceptors to the backside of the wafer. The presence of backside ammonia facilitates stoichiometry control across the entire surface of the wafer. Without backside reagent control one or more reagents may be depleted at the wafer edge.
5) Inclusion of a wafer preheat station within a PNL-WN deposition module.
6) Inclusion of a wafer preclean station within a PNL-WN deposition module
7) Inclusion of a reactive wafer preclean module using atomic and/or molecular fluorine to remove native oxides, etch residues, and other contaminants from semiconductor wafer surfaces
   a) Use of an inductively coupled plasma source to dissociate NF3, CF4, C2F6 or other fluorine containing gas as a source for atomic and molecular fluorine.
   b) Using reagent divert and line charge gas handling as described above to precisely control the dose amount of fluorine precursor arriving at the wafer for preclean. Over etch may cause undesirable fluorine attack of delicate structures such as shallow silicide junctions in direct plugfill applications.
8) Inclusion of a total chamber purge such that the majority of the top of the process module not occupied by reagent showerheads actively delivering reagent to semiconductor is actively purged by an inert carrier. In the preferred implementation the process showerheads are embedded in a purge plenum nominally flush with the showerhead face. This configuration can eliminate gas recirculation inside the deposition chamber and dramatically reduce the time required to flush reagent from the chamber. The gas curtain can also enhance station-to-station isolation in a multi-station chamber architecture.
9) Control all time-critical commands to valves and MFC's through an input-output controller (IOC) such that valve timing sequences are delivered to the IOC in a packet sufficiently comprehensive that all the commands for a deposition sequence can be run without pausing to write or read data to the computer controlling the deposition module. By eliminating slow write and read communication the IOC is able to control valve and other device timing within 10-20 ms, which is required for PNL-WN processing due to the short line charge, dose, and purge times required by some sequences.

It is understood that the examples and embodiments described herein are for illustrative purposes only and that various modifications or changes in light thereof will be suggested to persons skilled in the art and are to be included within the spirit and purview of this application and scope of the appended claims. For example, generally, all references to a hollow cathode magnetron can be replaced with references to a general-purpose physical vapor deposition (PVD) reactor. All publications, patents, and patent applications cited herein are hereby incorporated by reference in their entirety.

What is claimed is:

1. A method of forming a tungsten nitride layer on a substrate, the method comprising:
   (a) positioning the substrate in a deposition chamber;
   (b) depositing one or more layers of pulsed deposition tungsten (W) on the substrate; and
   (c) depositing one or more layers of pulsed deposition tungsten nitride (WN) on the one or more layers of pulsed deposition tungsten to generate a W—WN composite film comprising either a bilayer of W—WN or a multi-layered structure of multiple tungsten (W) and tungsten nitride (WN) layers, wherein step (c) comprises at least one pulse deposition cycle wherein the reducing agent comprises boron and at least one pulse deposition cycle wherein the reducing agent comprises a silicon hydride.

2. The method of claim 1, wherein the ratio of W and N atoms are present in the W and WN layers in a ratio of approximately 2-to-1.

3. The method of claim 1, further comprising providing a dopant to the one or more layers of pulsed deposition tungsten nitride.

4. The method of claim 3, wherein the dopant is at least one of phosphorus, arsenic, antimony, bismuth, boron, aluminum, gallium, indium, nitrogen, and thallium.

5. The method of claim 1 in which tungsten nitride deposition is carried out in a multi-station reaction chamber in which
   (i) pulsed nucleation layer (PNL) tungsten is deposited at one or more stations in the chamber;
   (ii) tungsten nitride is deposited at one or more deposition stations in the chamber; and
   (iii) the substrate is moved from one deposition station to another such that the layered film of tungsten nitride and PNL-tungsten is formed.

6. The method of claim 1, further comprising forming a metallic tungsten plug on the composite film to form a tungsten interconnect, wherein the composite film serves as at least one of an adhesion layer, a barrier layer, and/or a nucleation layer for subsequent tungsten growth.

7. The method of claim 1 further comprising repeating (b)-(c) to generate a multi-layered structure of multiple tungsten (W) and tungsten nitride (WN) layers.

8. A method of forming a tungsten nitride layer on a substrate, the method comprising:
   (a) positioning the substrate in a deposition chamber;
   (b) depositing one or more layers of pulsed deposition tungsten (W) on the substrate; and
   (c) depositing one or more layers of pulsed deposition tungsten nitride (WN) on the one or more layers of pulsed deposition tungsten to generate a W—WN composite film comprising either a bilayer of W—WN or a multi-layered structure of multiple tungsten (W) and tungsten nitride (WN) layers, wherein step (c) comprises:
      (i) depositing a gas phase boron-containing agent onto the one or more layers of pulsed deposition tungsten to form a boron-containing sacrificial layer on the one or more layers of pulsed deposition tungsten;
      (ii) exposing the boron-containing sacrificial layer to a tungsten containing precursor to form a tungsten layer; and
      (iii) exposing the tungsten layer to a nitriding agent to form at least a portion of the tungsten nitride layer.

9. A method of forming a W—WN layer on a substrate having a surface, the method comprising:
   (a) positioning the substrate in a deposition chamber;
   (b) depositing metallic tungsten on the substrate surface;
   (c) depositing a gas phase boron-containing agent onto the metallic tungsten to form a boron-containing sacrificial layer thereon;
   (d) exposing the boron-containing sacrificial layer to a tungsten containing precursor to form a tungsten layer on the metallic tungsten; and
   (e) exposing the tungsten layer to a nitriding agent to form at least a portion of a tungsten nitride layer on the metallic tungsten.

10. The method of claim 9 wherein step (b) comprises depositing metallic tungsten by chemical vapor deposition.

11. The method of claim 9 wherein step (b) comprises depositing metallic tungsten by a pulsed nucleation layer process.

12. The method of claim 9 further comprising repeating step (b) and/or steps (c)-(e) to generate either a bilayer of W—WN or a multi-layered structure of multiple tungsten and tungsten nitride layers.

13. The method of claim 9, wherein the ratio of W and N atoms are present in the W and WN layers in a ratio of approximately 2-to-1.

14. The method of claim 9, further comprising forming a metallic tungsten plug on the tungsten nitride layer to form a tungsten interconnect, wherein the tungsten nitride layer serves as at least one of an adhesion layer, a barrier layer, and/or a nucleation layer for subsequent tungsten growth.

15. The method of claim 9, wherein (c)-(e) form only a first portion of the tungsten nitride layer and further comprising:
   (f) exposing the substrate to a reducing agent to form a saturated layer of reducing agent on the metallic tungsten having the first portion of the tungsten nitride layer formed thereon;
   (g) exposing the saturated layer of reducing agent to a tungsten containing precursor to form a tungsten layer on the metallic tungsten having the first portion of the tungsten nitride layer formed thereon; and
   (h) exposing the tungsten layer to a nitriding agent to form at least a second portion of the tungsten nitride layer.

16. The method of claim 15 wherein the reducing agent is a silicon hydride.

17. The method of claim 10 in which tungsten nitride deposition is carried out in a multi-station reaction chamber in which
   (i) CVD tungsten is deposited at one or more stations in the reactor;
   (ii) tungsten nitride is deposited at one or more deposition stations in the chamber;
   (iii) the substrate is moved from one deposition station to another such that the layered film of CVD-tungsten and tungsten nitride is formed.

18. The method of claim 12 in which tungsten nitride deposition is carried out in a multi-station reaction chamber in which
   (i) PNL tungsten is deposited at one or more stations in the reactor;
   (ii) tungsten nitride is deposited at one or more deposition stations in the chamber;
   (iii) the substrate is moved from one deposition station to another such that the layered film of PNL-tungsten and tungsten nitride is formed.

* * * * *